United States Patent [19]

Stroppiana

[11] Patent Number: 4,675,560
[45] Date of Patent: Jun. 23, 1987

[54] STATIC RELAY HAVING MEANS FOR DETECTING LOAD DEFECTS

[75] Inventor: Robert J. Stroppiana, Paris, France

[73] Assignee: U.S. Philips Corporation, New York, N.Y.

[21] Appl. No.: 724,698

[22] Filed: Apr. 18, 1985

[30] Foreign Application Priority Data

May 11, 1984 [FR] France ................. 84 07309

[51] Int. Cl.⁴ ................ H03K 17/60; H03K 19/08; H02G 3/00; B62D 45/00
[52] U.S. Cl. ................ 307/570; 307/10 LS; 307/446; 307/254
[58] Field of Search ............ 307/570, 253, 254, 446, 307/584, 585, 125, 10 LS, 10 BP; 340/825.18; 361/212, 220, 160, 87, 161; 323/277, 279

[56] References Cited

FOREIGN PATENT DOCUMENTS 0154608 9/1985 European Pat. Off. ......... 307/253
3120529 4/1982 Japan ........................ 307/254
0188133 11/1982 Japan ........................ 307/254

Primary Examiner—Stanley D. Miller
Assistant Examiner—Trong Q. Phan
Attorney, Agent, or Firm—Robert T. Mayer; Bernard Franzblau

[57] ABSTRACT

A static relay for direct voltages. A load (Z) is energized via the collector of an output transistor ($T_s$) of the pnp type. The state of the relay and that of the load are detected by a first bipolar detection transistor ($T_{c1}$) having its base-emitter path, to which a base resistor ($R_b$) is added, connected parallel to the base-emitter path of the output transistor ($T_s$). A second detection transistor ($T_{c2}$) of the MOSFET type has its drain connected to the collector of the first detection transistor ($T_{c1}$) and its gate connected to the collector of the output transistor ($T_s$). The source electrode of the second detection transistor constitutes a detection terminal (C) which, when it is loaded by a resistor ($R_c$), delivers a voltage ($V_c$) of high level in the case of normal operation of the relay.

12 Claims, 4 Drawing Figures

STATIC RELAY HAVING MEANS FOR DETECTING LOAD DEFECTS

This invention relates to a transistor relay for direct current to be supplied to a load comprising a bipolar output transistor of a first conductivity type having its collector connected to an output terminal to which the load is to be connected and which is in turn connected to a common voltage supply terminal. The emitter of the output transistor is connected to a supply terminal and it is driven into conduction by a signal applied to its base.

Such a transistor relay can be used especially in the field of electrical equipment for automobiles, in which application it can advantageously replaced the conventional systems comprising electro-magnetic relays.

Such a relay can be used in the case of electrical equipment for autombiles in which the various bulbs have to be fed by control transistors at the nominal voltage of the battery. However, it has no means for identifying anomalies relative to the load, i.e. non-connection or shortcircuiting of the latter, nor does it provide, as in preferred embodiments, means for protecting against anomalies relative to the electric supply of the relay.

The invention thus relates to a device of the aforementioned kind which comprises a first bipolar detection transistor, also of the first conductivity type, having its emitter base path, connected parallel to the emitter-base path of the bipolar output transistor via a base resistor. A second detection transistor comprising a MOSFET of the enhancement type having a channel of the second conductivity type, a drain connected to the collector of the first detection transistor and a gate connected to the collector of the output transistor. As a result of these connections, that a signal representative of the state of the load is produced at the source of the second detection transistor.

The relay according to the invention can be realized in the form of an integrated circuit.

According to a preferred modification, a control signal is applied to the gate of a control transistor and the detection signal is directly obtained from the collector of the detection transistor and is directly used for realizing self-biasing of the relay.

The relay for this purpose comprises a MOS field effect control transistor of the enhancement type having a channel of the second conductivity type, a source connected to the common supply terminal and a drain connected to the base of the output transistor through a current limiting resistor. The gate of the MOSFET control transistor is controlled via a control terminal and is connected on the one hand to the common supply terminal through a self-bias resistor and on the other hand to the source of the second detection transistor in a manner such that a self-bias voltage is applied to the gate of the control transistor in the normal state of the load.

According to an embodiment of the invention, the relay delivers a detection signal according to a logic state. The relay for this purpose comprises a blocking transistor of the enhancement type having a channel of the second conductivity type, a drain-source path connected parallel to the self-bias resistor and a gate connected to the said control terminal. A logic circuit formed by two MOS field effect detection transistors of the enhancement type are connected in series and have channels of opposite conductivity types. The first transistor has its gate connected to the control terminal and the second transistor has its gate connected to the drain of the control transistor in a manner such that a detection signal having two states is transmitted to a logic detection terminal.

An on/off control of the relay is also possible due to a calibrated pulse generator circuit comprising a first and a second resistor, each having one electrode connected to the supply terminal, while its other electrode is connected to a respective electrode of a capacitor. The electrode common to the capacitor and to the second resistor is connected to the gate of a MOS field effect transistor of the enhancement type having a channel of the first conductivity type, a source connected to the supply terminal and a drain connected to the gate of the control transistor. The junction between the capacitor and the first resistor is connected to the control terminal in a manner such that, when the control terminal is grounded, the pulse generator circuit produces an activation pulse.

According to this embodiment, the first transistor of the logic circuit has a channel of the first conductivity type and has its drain connected to the logic detection terminal, its source connected to the source of the second transistor, whose drain is connected to the supply terminal.

According to an advantageous modification, the control terminal is acted upon by a logic MOS field effect control transistor of the enhancement type, whose drain-source path is connected between the common supply terminal and the control terminal in a manner such that its gate receives a logic control signal, for example TTL, permitting the control terminal to be grounded as described above.

The self-biasing of the relay can also be obtained in that a second self-bias resistor is connected between the source of the second detection transistor and the non-grounded electrode of the first self-bias resistor in a manner such that it forms therewith a voltage divider.

In order that the invention may be readily carried into effect, it will now be described more fully, by way of example, with reference to the accompanying drawing, in which.

Figure 1:
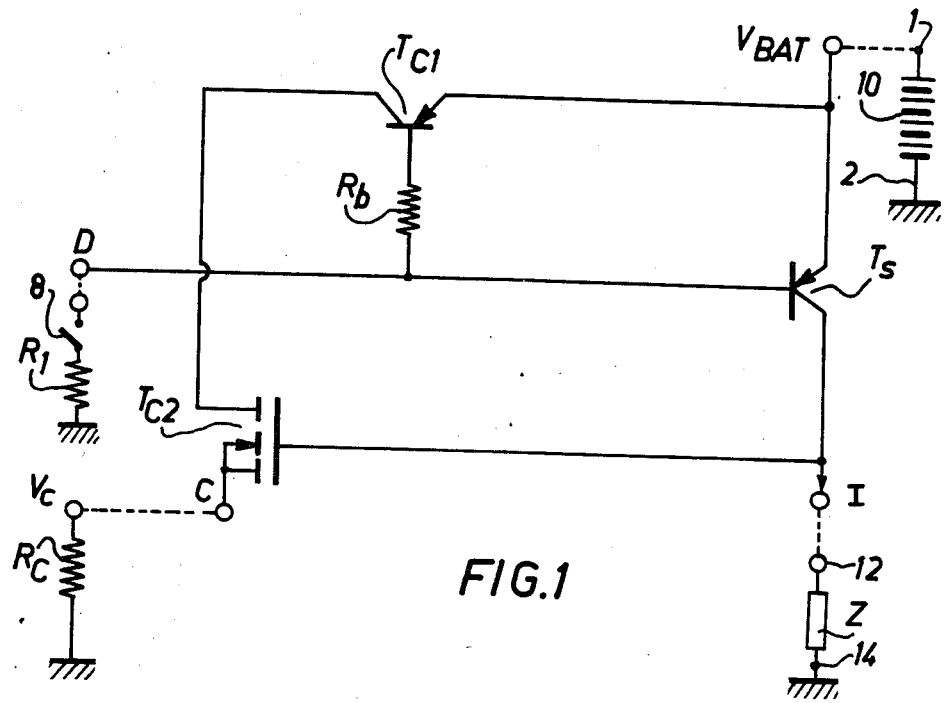
FIG. 1 shows a circuit diagram of a relay according to the invention.

In FIG. 1, a bipolar pnp transistor $T_5$ of the p-type has its emitter-collector path connected between a first terminal 1 of a supply source 10 and a first connection 12 of a load Z. The other terminal 2 of the supply source and the other connection 14 of the load are each connected to a common connection terminal. The supply source 10 is a direct low voltage source, whose voltage $V_{bat}$ has a value of, for example, 12 V in the case of a battery.

The output transistor $T_s$ is controlled in a conventional manner through its base connected to a control terminal D. An interrupter 8 arranged externally of the circuit permits of connecting the control terminal D to one end of a resistor $R_1$, whose other end is connected to the common connection terminal. When the interruptor 8 is closed, the emitter-collector path of the output transistor $T_s$ passes to the forward or conductive state and the load Z is fed. A first bipolar detection transistor $T_{c1}$ also of the p-type has its emitter-base path connected parallel to the emitter-base path of the output transistor $T_s$, that is to say that the emitter of the transistor $T_{c1}$ is connected to that of the transistor $T_s$ and to the supply terminal $V_{bat}$ and that the base of the transistor $T_{c1}$ is connected to the base of the output transistor $T_s$ via a base resistor $R_b$.

The collector of the first detection transistor $T_{c1}$ is connected to the drain of a second MOS field effect detection transistor $T_{c2}$ of the enhancement type having an n-type channel. The gate of transistor $T_{c2}$ is connected to the collector of the output transistor $T_s$ and its source is connected to a detection terminal C. When the latter is loaded by a resistor $R_c$ arranged between the terminal C and ground, the terminal C delivers a voltage $V_c$ representative of the state of the load Z.

Figure 2:
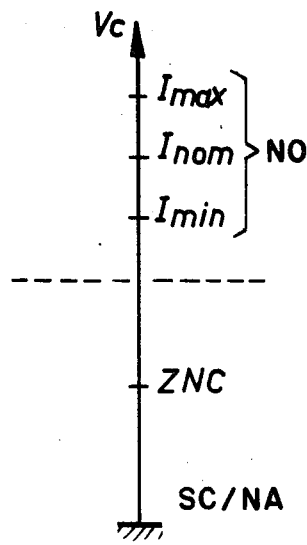
FIG. 2 shows a diagram of the voltages received at the terminal C of FIG. 1 according to the various states of the load.

A diagram of the various significant values of the voltage $V_c$ is shown in FIG. 2.

In the case of normal operation of the relay (NO), the collector of the output transistor $T_s$ supplies to the load Z a current having a value lying between a minimum $I_{min}$ and a maximum $I_{max}$, which corresponds to the supply of current upon the ignition, when the load Z is a lamp, for example a car headlight, or an inductive load. In the energized state, the current is stabilized at a nominal value $I_{nom}$.

When the relay is controlled (closed interruptor 8) and the state of the load is normal ($I_{min} < I < I_{max}$), the voltage $V_c$ is adjusted to a value which is higher by the same amount as I is closer to $I_{max}$. This is due to the fact that the collector of the transistor $T_{c1}$ delivers to $R_c$ a current which increases as a function of the current I. This current traverses the drain-source path of the second detection transistor $T_{c2}$ which is made to conduct due to the fact that the gate of $T_{c2}$ is at the potential of the collector of the output transistor $T_s$ (near $V_{bat}$).

In the case in which the load is not connected (ZNC), the collector of $T_s$ does not supply a current so that its potential remains at a high level, which causes the second detection transistor $T_{c2}$ to remain in the conductive state. The collector of the first detection transistor $T_{c1}$ delivers to $R_c$ a small current, which generates at the control terminal C a voltage $V_c$ much lower than that received in the case of normal operation.

In the case in which the load Z is short-circuited (SC), the gate of the second detection transistor $T_{c2}$ is at zero potential, which causes the latter to be cut off. Therefore, the potential $V_c$ is also zero.

In the case in which the relay is not activated (NA), the same configuration is obtained as in the preceding case. The current in the collector of the output transistor $T_s$ being zero, the gate of the second detection transistor $T_{c2}$ is at zero potential and the potential $V_c$ is zero.

Summarizing, when the relay is in the normal operating state, a voltage $V_c$ situated in a high range is received at the detection terminal C, while the deactivation of the relay or the variations in operation induce at this terminal voltages $V_c$ which are low or zero.

Figure 3:
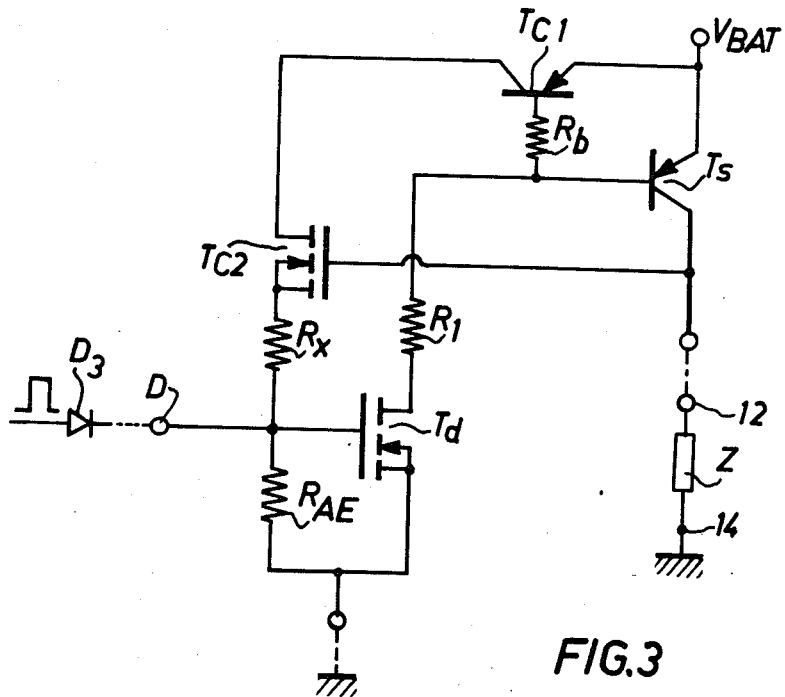
FIG. 3 shows a modification of the invention with self-biasing of the relay.

According to FIG. 3, the relay is self-biased. For this purpose, the signal available at the source of the second detection transistor $T_{c2}$ is utilized.

The pulsatory signal transmitted to the control terminal D through an isolation diode $D_3$ is received by the gate of a MOS field effect control transistor $T_d$ of the enhancement type having an n-type channel, and whose drain is in turn connected to the base of the output transistor $T_s$ through a resistor $R_1$. The relay is self-biased and so it can be controlled by a pulse. This pulse has a duration sufficient to force the control during the increase of the current in the load Z. In other words, the control pulse at terminal D should be long enough to give the current in load Z time to rise. The source of the transistor $T_d$ is connected to ground, which ensures that, as long as the control transistor $T_d$ is in the conductive condition, the resistor $R_1$ is connected between the base of $T_s$ and ground.

The source of the second detection transistor $T_{c2}$ is connected to the control terminal D. The self-bias of the relay is obtained due to a so-called self-bias resistor $R_{AE}$ connected between the gate of the control transistor $T_d$ and ground.

By way of example, if the relay is in integrated monolithic form, it should be noted that the transistor $T_{c1}$ will generally be a lateral transistor having an amplification lower than or equal to 30. In such a case, a resistor $R_b$ of the order of 1 kΩ is suitable.

The value of $R_b$ having once been adjusted, the control of the self-bias is obtained by influencing the value of $R_{AE}$ in a manner such that, as soon as the voltage at the terminal D approaches that corresponding to the condition of a non-connected load, the control transistor $T_d$ breaks down. A resistor $R_x$ of low value may also be arranged in series between $R_{AE}$ and the source of $T_{c2}$.

Figure 4:
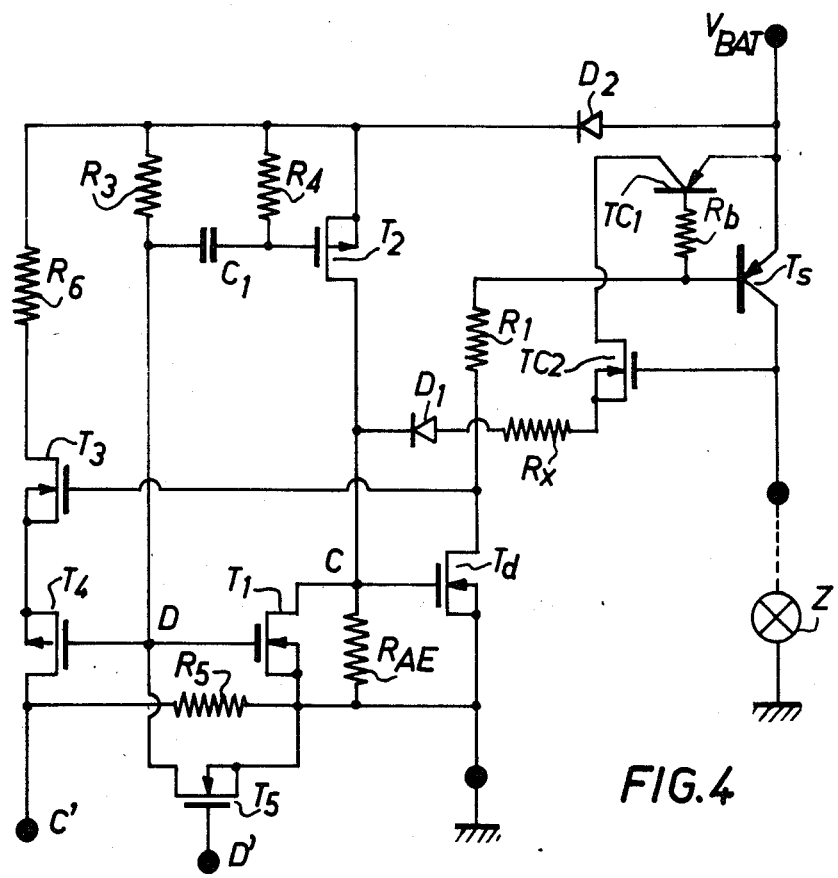
FIG. 4 shows a modification of FIG. 3 which delivers a logic detection signal.

The embodiment shown in FIG. 4 permits control of the relay by means of a logic level applied to the gate of a MOS field effect transistor $T_5$ of the enhancement type having an n-type channel. It comprises a calibrated pulse generator comprising two resistors $R_3$ and $R_4$ having a common electrode connected to the supply source $V_{bat}$, their other electrode being connected to each of the respective electrodes of a capacitor $C_1$, for example the internal capacitance of an integrated MOS transistor. The terminal common to the capacitor $C_1$ and to the resistor $R_4$ is connected to the gate of a MOS field effect transistor $T_2$ of the enhancement type having a p-type channel. The source electrode of transistor $T_2$ is coupled to the voltage $V_{bat}$ and its drain, which constitutes the output of the pulse generator, is connected to the gate of the control transistor $T_d$. The terminal common to the capacitor $C_1$ and to the resistor $R_3$ is connected to the control terminal D. When the latter is grounded by rendering the transistor $T_5$ conductive, the gate of the transistor $T_2$ is instantaneously at the zero potential and the capacitor $C_1$, one electrode of which is grounded, is charged through $R_4$ with a time constant $R_4 C_1$. The transistor $T_2$ consequently passes a current via its source-drain path as long as its gate potential has not increased again to a sufficient level, which becomes manifest at the end of a given time by charging of the capacitor $C_1$. Consequently, a pulse is received at the drain of $T_2$ feeding the gate of the control transistor $T_d$ in a manner such that the latter is rendered conductive. The gate-drain space of $T_2$ fulfills the function of the isolation diode $D_3$ of FIG. 3. After the pulse at the drain of $T_2$ has disappeared, the relay is self-bias, as in the case of FIG. 3.

A MOS field effect blocking transistor $T_1$ of the enhancement type having an n-type channel has its drain-source path connected to the terminals of the self-bias resistor $R_{AE}$, its source being grounded. The gate of the transistor $T_1$ is connected to the control terminal D. When the transistor $T_5$ is cut off, the gate of the transistor $T_1$ is at a high potential and the blocking transistor T₁ shortcircuits the self-bias resistor R_AE. As a result, the gate of the control transistor T_d is grounded, which leads to the deactivation of the relay. On the contrary, when the transistor T₅ is rendered conducting, the gate of the blocking transistor T₁ is grounded and the resistor R_AE is no longer shortcircuited.

The circuit shown in FIG. 4 also has a logic detection terminal C' controlled by a logic detection circuit comprising two MOS field effect transistors T₃ and T₄ of the enhancement type having channels of opposite types. The transistor T₃ has an n-type channel and has its drain connected to the supply voltage V_bat through a polarization resistor R₆, while its gate is connected to the drain of the control transistor T_d and its source is connected to that of the transistor T₄ having a p-type channel. The gate of T₄ is connected to the control terminal D and its drain, which constitutes the logic detection terminal C', is connected to the common connection terminal through a division resistor R₅ in a manner such that it is compatible with logic levels (for example TTL). The logic terminal C' operates according to the following truth table:

| | |
|---|---|
| Not Activated (T₅ cut-off) | 0 |
| Operating (T₅ conducting) | 0 |
| Operating + ZNC | 1 |
| Operating + SC | 1 |

The circuit shown in FIG. 4 is controlled by a logic control terminal D' connected to the gate of the logic MOS field effect transistor T₅ of the enhancement type.

If, as shown, this transistor has an n-type channel, its source being grounded and its drain being connected to the control terminal D, a logic "1" signal at the gate of the transistor T₅ renders its emitter-drain path conductive and causes the relay to be activated. If the transistor T₅ has a p-type channel, its source being connected to the control terminal D and its drain being grounded, the control is effected at the logic terminal D' according to an inverse logic.

A diode D₂ connected between the supply terminal V_bat and the source of T₂ and conductive in the foward direction when the supply voltage is correctly connected, protects the relay in the case of accidental inversion of the supply voltage V_bat.

According to a modification operating according to an inverse logic, the logic signal of the logic detection circuit is derived at the drain of T₃, which is no longer connected to V_bat, the drain of T₄ being in turn connected to ground.

What is claimed is:

1. A static relay for direct current to be supplied to a load comprising a bipolar output transistor of a first conductivity type (p) having a collector connected to an output terminal to which the load is to be connected, said load to be further connected to a common supply terminal, an emitter of said bipolar output transistor being connected to a voltage supply terminal, said bipolar output transistor being driven into conduction in response to a signal applied to its base from a control terminal, characterized in that it comprises a bipolar detection transistor of the first conductivity type having an emitter-base path including a base resistor, means connecting the emitter-base path of said bipolar detection transistor in parallel with the emitter-base path of said bipolar output transistor, and a MOS field effect detection transistor of the enhancement type having a channel of the second conductivity type (n) and a drain connected to the collector of said bipolar detection transistor and a gate connected to the collector of said bipolar output transistor to produce a signal representative of the state of the load at the source electrode of said MOS field effect detection transistor.

2. A static relay as claimed in claim 1 further comprising a MOS field effect control transistor of the enhancement type having a channel of the second conductivity type (n), means connecting a source electrode of the MOS field effect control transistor to said common supply terminal and a drain electrode to the base of the bipolar output transistor through a current limiting resistor, and wherein a gate electrode of the MOS field effect control transistor is controlled via the control terminal and is connected to the common supply terminal through a self-bias resistor and to the source electrode of the MOS field effect detection transistor to produce a self-biasing voltage which is applied to the gate of the MOS field effect control transistor in the normal state of the load.

3. A static relay as claimed in claim 2, characterized in that it comprises a MOS field effect blocking transistor of the enhancement type having a channel of the second type (n), a drain-source path connected parallel to the self-bias resistor and a gate connected to said control terminal, and a logic circuit including first and second series-connected MOS field effect detection transistors of the enhancement type having channels of opposite types, the first transistor having a gate connected to the control terminal and the second transistor having a gate connected to the drain of the MOS field effect control transistor to produce a detection signal having two states at a logic detection terminal connected to said first transistor.

4. A static relay as claimed in claim 3, characterized in that it comprises a calibrated pulse generator circuit comprising a first and a second resistor each having an electrode connected to the voltage supply terminal, its other electrode being connected to a respective electrode of a capacitor, the electrode common to the capacitor and to the second resistor being is connected to the gate of a MOS field effect transistor of the enhancement type having a channel of the first conductivity type (p), whose source is connected to the voltage supply terminal and whose drain is connected to the gate of said control transistor, the junction between the capacitor (C₁) and the first resistor being connected to said control terminal in a manner such that, when the control terminal is connected to ground, the pulse generator circuit produces an activating pulse.

5. A static relay as claimed in claim 4, characterized in that said first transistor of the logic circuit has a channel of the first conductivity type (p) and a drain connected to the logic detection terminal and a source connected to the source of said second transistor, whose drain is connected to the voltage supply terminal.

6. A static relay as claimed in claim 3, characterized in that the control terminal is coupled to a logic MOS field effect control transistor of the enhancement type having a drain-source path connected between the common supply terminal and the control terminal and with a gate that receives a logic control signal permitting the control terminal to be connected to the common supply terminal.

7. A static relay as claimed in claim 3, characterized in that it comprises a second self-bias resistor connected between the source electrode of said MOS field effect detection transistor and an electrode of the first self-bias resistor such that it forms with the latter resistor a voltage divider.

8. A static relay as claimed in claim 3 wherein said first transistor of the logic circuit comprises a channel of the first conductivity type (p), a drain electrode connected to the logic detection terminal and a source electrode connected to the source electrode of said second transistor of the logic circuit, the drain electrode of said second transistor being connected to the voltage supply terminal.

9. A static relay as claimed in claim 4 further comprising a second self-bias resistor connected in series with the first self-bias resistor between the source electrode of said MOS field effect detection transistor and the common supply terminal.

10. A static relay for energizing a load comprising: a voltage supply terminal and a common terminal for connection to a source of supply voltage, an output terminal, a bipolar output transistor connected between the voltage supply terminal and the output terminal, a bipolar detection transistor of the same conductivity type as the bipolar output transistor and having an emitter-base path, means connected the emitter-base path of the bipolar detection transistor in parallel with the emitter-base path of the bipolar output transistor via a base resistor, a detection terminal for indicating the state of a load to be connected to the output terminal, a MOSFET detection transistor connected in series with the bipolar detection transistor between said voltage supply terminal and said detection terminal, means connecting a gate electrode of said MOSFET detection transistor to the output terminal, and means coupling a control terminal to a base of said bipolar output transistor for applying a switching signal to the bipolar output transistor.

11. A static relay as claimed in claim 10 wherein said coupling means comprises a MOSFET control transistor having a gate electrode connected to said control terminal and means connecting said MOSFET control transistor between the base of the bipolar output transistor and said common terminal, said static relay further comprising a self-bias resistor connected between the gate electrode of said MOSFET control transistor and the common terminal.

12. A static relay as claimed in claim 11 further comprising means coupling the self-bias resistor to said MOSFET detection transistor such that said bipolar detection transistor, said MOSFET detection transistor and the self-bias resistor form a series circuit between the voltage supply terminal and the detection terminal.

* * * * *